(12) United States Patent
Kim et al.

(10) Patent No.: US 10,020,107 B1
(45) Date of Patent: Jul. 10, 2018

(54) HYBRID INDUCTOR

(71) Applicant: SAMSUNG ELECTRO-MECHANICS CO., LTD., Suwon-si (KR)

(72) Inventors: Jeong Hae Kim, Suwon-si (KR); Seong Jong Cheon, Suwon-si (KR); Sung Jae Yoon, Suwon-si (KR); Se Jong Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/787,228

(22) Filed: Oct. 18, 2017

(30) Foreign Application Priority Data

Jan. 10, 2017 (KR) .................. 10-2017-0003424

(51) Int. Cl.
| | | |
|---|---|---|
| H05K 1/16 | (2006.01) | |
| H05K 7/00 | (2006.01) | |
| H05K 1/18 | (2006.01) | |
| H01F 27/00 | (2006.01) | |
| H01F 27/28 | (2006.01) | |
| H01F 27/29 | (2006.01) | |

(52) U.S. Cl.
CPC ....... *H01F 27/006* (2013.01); *H01F 27/2804* (2013.01); *H01F 27/292* (2013.01); *H05K 1/182* (2013.01); *H01F 2027/2809* (2013.01)

(58) Field of Classification Search
CPC .............. H01F 27/006; H01F 27/2804; H01F 2027/2809; H01F 27/292; H05K 1/182

USPC .................. 174/260; 361/760, 761
See application file for complete search history.

(56) References Cited

U.S. PATENT DOCUMENTS

| | | | | |
|---|---|---|---|---|
| 2004/0124961 A1* | 7/2004 | Aoyagi | ............... | H01F 17/0033 336/200 |
| 2007/0090912 A1* | 4/2007 | Lee | ..................... | H01F 17/0013 336/200 |
| 2008/0002380 A1* | 1/2008 | Hazucha | ............... | H01L 23/645 361/760 |
| 2011/0061925 A1* | 3/2011 | Kim | ..................... | H05K 1/0233 174/377 |
| 2014/0027880 A1* | 1/2014 | Duevel | ............... | H01F 17/0006 257/531 |
| 2016/0351317 A1 | 12/2016 | Cheon | | |
| 2017/0062120 A1* | 3/2017 | Yun | ..................... | H01F 27/2804 |

FOREIGN PATENT DOCUMENTS

| | | |
|---|---|---|
| JP | 2000-182851 A | 6/2000 |
| JP | 2015-219878 A | 12/2015 |
| KR | 10-2013-0112241 A | 10/2013 |
| KR | 10-2016-0141561 A | 12/2016 |

* cited by examiner

*Primary Examiner* — Sherman Ng
(74) *Attorney, Agent, or Firm* — NSIP Law

(57) ABSTRACT

A hybrid inductor includes a board, a first inductor provided in the board and including conductive patterns disposed at different heights, and a second inductor mounted on the board and an end of the second inductor being connected to the conductive patterns. Since mutual inductance is generated, inductance higher than a capacity value of a single inductor may be obtained.

19 Claims, 4 Drawing Sheets

HYBRID INDUCTOR

CROSS-REFERENCE TO RELATED APPLICATION(S)

This application claims the benefit under 35 USC § 119(a) of Korean Patent Application No. 10-2017-0003424 filed on Jan. 10, 2017 in the Korean Intellectual Property Office, the entire disclosure of which is incorporated herein by reference for all purposes.

BACKGROUND

1. Field

The present disclosure relates to a compact hybrid inductor having increased inductance.

2. Description of Related Art

An inductor, a passive element forming an electronic circuit together with a resistor and a capacitor, is used in various apparatuses and components such as, for example, a low-noise amplifier, a mixer, a voltage-controlled oscillator, and a matching coil.

As electronic devices are increasingly reduced in size, electronic element modules installed in electronic devices need to be compact. However, as the size of an inductor is reduced, a capacity value, i.e., inductance, of the inductor has a limitation and a quality factor may also be degraded. Also, because generally only one inductor is mostly used, it is difficult to realize high inductance.

SUMMARY

This Summary is provided to introduce a selection of concepts in a simplified form that are further described below in the Detailed Description. This Summary is not intended to identify key features or essential features of the claimed subject matter, nor is this Summary intended to be used as an aid in determining the scope of the claimed subject.

In one general aspect, there is provided a hybrid inductor including a board, a first inductor provided in the board and including conductive patterns disposed at different heights, and a second inductor mounted on the board and an end of the second inductor being connected to the conductive patterns.

The conductive patterns may form a first coil member.

The second inductor may include a second coil member within a ceramic body.

The second coil member may be concentric with the first coil member.

A winding direction of the first coil member and a winding direction of the second coil member may be same.

Each conductive pattern of the conductive patterns may include a coil turn on a layer, and the conductive patterns may be connected to each other by a connection conductor penetrating through an insulating layer.

A central axial line of the second coil member may be offset from and parallel to a central axial line of the first coil member.

A winding direction of the first coil member and a winding direction of the second coil member may be same.

The conductive patterns may be linearly formed on a first layer and may be spaced apart from each other, and the conductive patterns formed on the first layer may be connected to other conductive patterns formed on a second layer by a connection conductor penetrating through an insulating layer.

The hybrid inductor may include a connection pad provided on a surface of the board and the second inductor being mounted on the connection pad.

The hybrid inductor may include an electronic component mounted on the board.

The second coil member may include stacked conductive patterns and conductive vias connecting the stacked conductive patterns.

The stacked conductive patterns may be connected in parallel.

The stacked conductive patterns may be connected in series.

Each stacked conductive pattern of the stacked conductive patterns may include a conductive metal having a preset thickness being disposed in a ceramic layer.

In another general aspect, there is provided a hybrid inductor including a board-type inductor including conductive patterns that are disposed at different heights of the board, and a surface-mounted device type inductor mounted on the board type inductor and having an end connected to the conductive patterns.

A coil member of the surface-mounted device type inductor may be disposed to be concentric with a coil member of the board type inductor.

The coil member of the surface-mounted device type inductor and the coil member of the board type inductor each may have a solenoid structure, and a central axial line of the coil member of the surface-mounted device type inductor may be parallel to a central axial line of the coil member of the board type inductor.

The board type inductor may be mounted on a board.

The board type inductor may be embedded in a board.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for the purposes of clarity, illustration, and convenience.

DETAILED DESCRIPTION

Figure 1:
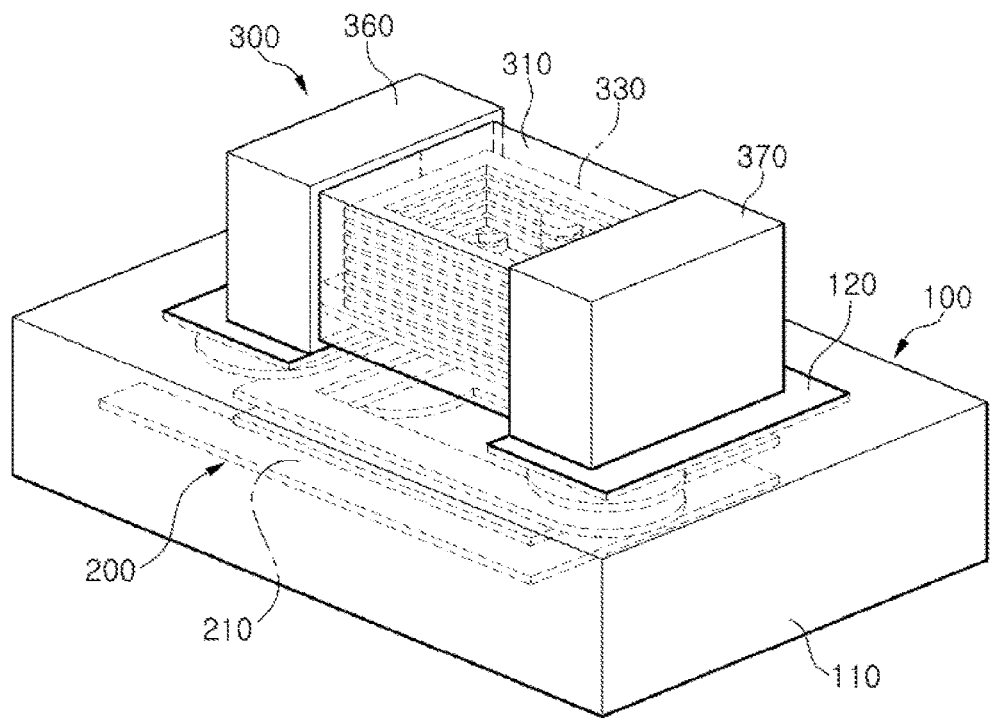
FIG. 1 is a diagram illustrating an example of a hybrid inductor.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after gaining a thorough an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

Throughout the specification, when an element, such as a layer, region, or substrate, is described as being "on," "connected to," "coupled to," "over," or "covering" another element, it may be directly "on," "connected to," "coupled to," "over," or "covering" the other element, or there may be one or more other elements intervening therebetween. In contrast, when an element is described as being "directly on," "directly connected to," "directly coupled to," "directly over," or "directly covering" another element, there can be no other elements intervening therebetween.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. As used herein, the term "and/or" includes any one and any combination of any two or more of the associated listed items.

Due to manufacturing techniques and/or tolerances, variations of the shapes shown in the drawings may occur. Thus, the examples described herein are not limited to the specific shapes shown in the drawings, but include changes in shape that occur during manufacturing.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

As wireless communication systems have been reduced in weight, thickness, length, and size, electronic element modules installed in electronic devices need to be compact. In the examples described below, an inductor is configured such that a surface-mounted device type inductor is mounted on a board or a board type inductor having a spiral or meandering shape is formed within a board to have the same inductance as that of the surface-mounted device type inductor.

The surface-mounted inductor is not easy to secure high inductance and a quality factor within a small space. Also, the board type inductor including a spiral or meandering conductive pattern within a board needs a space larger than that of the surface-mounted device type inductor and a ground surface to be formed around the inductor not to affect other components within a module or a device.

In the examples disclosed above, a space in which the surface-mounted device type inductor is mounted is expanded three-dimensionally and a board type inductor having the same form or shape as that of the surface-mounted device type inductor is formed on one side of the surface-mounted device type inductor to generate mutual inductance, to provide a hybrid inductor that is compact and has increased inductance.

Figure 2:
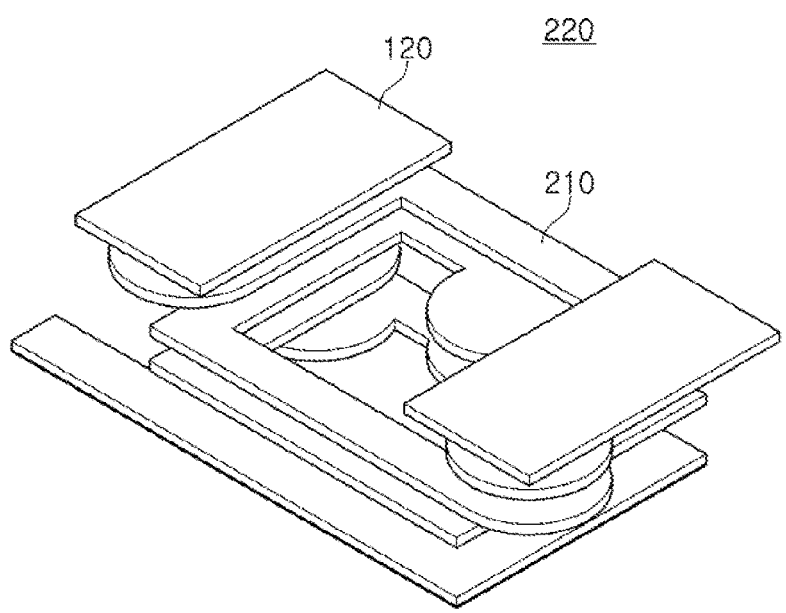
FIG. 2 is a diagram illustrating an example of a first coil member of a first inductor illustrated in FIG. 1.
Figure 3:
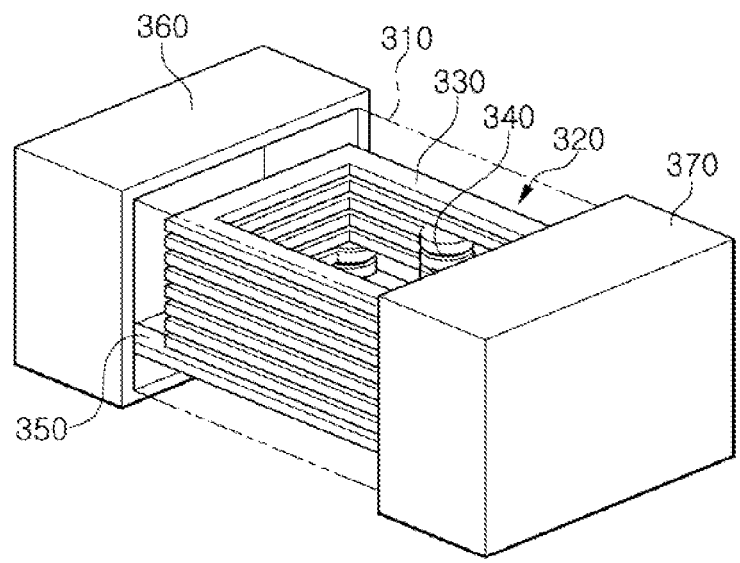
FIG. 3 is a diagram illustrating an example of a second coil member of a second inductor illustrated in FIG. 1.
Figure 4:
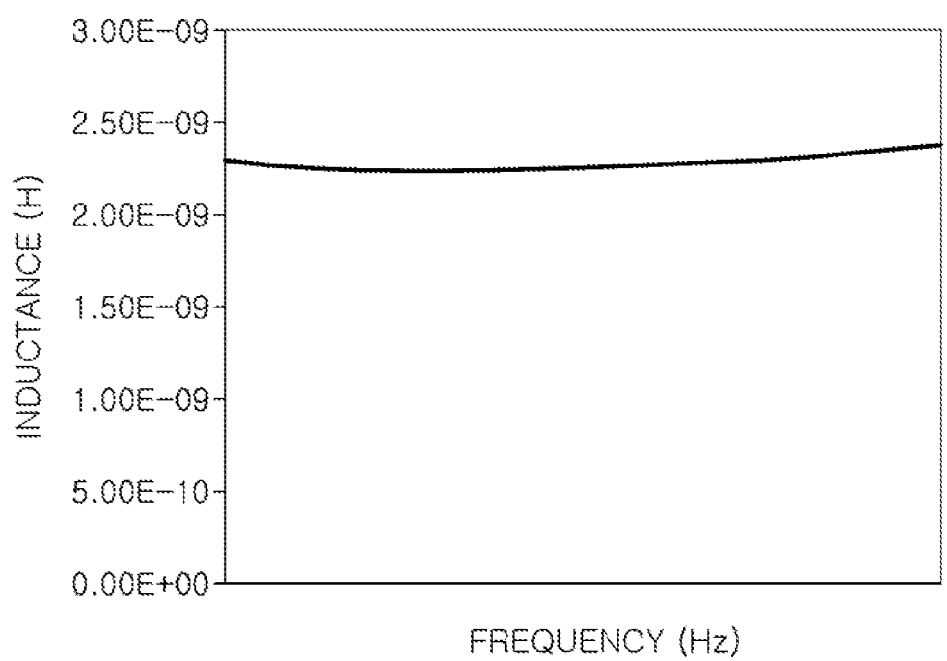
FIG. 4 is a diagram illustrating an example of inductance of the hybrid inductor illustrated in FIG. 1.

FIG. 1 is a diagram illustrating an example of a hybrid inductor. FIG. 2 is a diagram illustrating an example of a first coil member of a first inductor illustrated in FIG. 1. FIG. 3 is a diagram illustrating an example of a second coil member of a second inductor illustrated in FIG. 1, and FIG. 4 is a diagram illustrating inductance for the frequency change of the hybrid inductor illustrated in FIG. 1.

As illustrated in FIGS. 1 to 4, a hybrid inductor according to a first example includes a board 100, a first inductor 200 provided in the board 100 and including a plurality of conductive patterns 210 having inductance and different heights, and a second inductor 300 mounted on the board 100. One end of the second inductor 300 is electrically connected to the conductive patterns 210.

In an example, the board 100 is formed as a multilayer circuit board in which insulating layers 110 on which the conductive pattern 210 is formed are stacked.

In an example, the multilayer circuit board is a general printed circuit board (PCB). However, the multilayer circuit board formed of other materials, such as a flexible board such as a film board, are considered to be well within the scope of the present disclosure. Various other boards, such as, a ceramic board or a glass board, may be used as long as the conductive patterns 210 can be formed on the board.

For example, as the board 100 forming the hybrid inductor, a multilayer board in which the conductive patterns 210 are stacked as three or more layers may be used.

In an example, the conductive pattern 210 is formed in a region of the insulating layer 110, and a wiring pattern (not shown) for transmission of an electrical signal is formed in another region of the insulating layer 110 where no conductive pattern is formed. However, the present disclosure is not limited thereto and in another example, the conductive pattern 210 may be formed in the entirety of the insulating layer 110.

In an example, the conductive pattern 210 for forming a coil is formed on only some of the insulating layers 110 forming the board 100. In an example, the conductive pattern 210 for a coil may be formed only on three to four insulating layers among a total of seven insulating layers.

In an example, a wiring pattern (not shown) for transmission of an electrical signal is formed on the other insulating layers 110 without the conductive pattern 210. However, the present disclosure is not limited thereto and variously modifications, such as forming the conductive patterns on the entirety of the insulating layers are considered to be well within the scope of the present disclosure.

In an example, the wiring pattern electrically connects the conductive pattern 210 to the exterior. In an example, where the board 100 is used as a main board of a device, the wiring pattern may be a pattern for forming a circuit of the main board.

In an example, a connection pad 120, on which the second inductor 300 is mounted, is formed on an upper surface of the board 100. In an example, the second inductor 300 is adhered to the connection pad 120 by the medium of a conductive member (not shown), such as solder, and electrically connected to the first inductor 200.

In an example a board type inductor embedded in the board 100 is used as the first inductor 200. The first inductor 200 may be a board type inductor in which a first coil member 220 is formed by the conductive pattern 210 in the board 100.

In an example, the conductive pattern 210 forming the first coil member 220 is a conductive pattern formed to have inductance in the board 100.

A plurality of coil turns forming the first coil member 220 may be dispersed as several layers of the conductive pattern 210, i.e., one coil turn is formed by the conductive pattern of each layer.

In an example, the conductive patterns 210 of the respective layers are electrically connected to each other by a connection conductor (not shown) penetrating through the insulating layer 110. The conductive patterns 210 may complete one first continuous coil member 220 by the connection conductor.

In an example of the hybrid inductor, the conductive pattern 210 of the first coil member 220 has a helical structure overall. However, a structure of the conductive pattern is not limited thereto and other shapes such as, a spiral structure having a substantially conic shape are considered to be well within the scope of the present disclosure.

Although not shown, a pad or a pin-type connection terminals (not shown) adhered to a main board (not shown) on which the hybrid inductor is mounted may be provided on a lower surface of the first inductor 200. In an example, the connection terminals may be electrically connected to each of the first inductor 200 and the second inductor 300.

Also, as described above, the board 100 including the first inductor 200 may be formed as a main board. For example, when the first coil member 220 using the conductive patterns 210 and the connection pad 120 are formed in a main board on which at least one electronic component, in addition to the second inductor 300, is mounted, rather than forming the first inductor 200 in a separate board, the main board may be utilized as a board where the first inductor 200 is formed.

In an example, as the second inductor 300, a surface-mounted device type inductor or a chip type inductor is employed. Thus, the second inductor 300 includes a ceramic body 310 and a second conductive coil member 320 formed within the ceramic body.

In an example, the second conductive coil member 320 includes stacked conductive patterns 330 and a plurality of conductive vias 340 connecting the conductive patterns 330 in parallel or in series to complete a coil.

The ceramic body 310 is formed by stacking a plurality of ceramic layers formed as sheets formed of ceramics in a thickness direction and sintering the stacked ceramic layers. Here, a shape and dimensions of the ceramic body 310 and the number of stacked ceramic layers are not limited to those illustrated in FIGS. 1 to 3, and other shapes and dimensions of the ceramic body 310 are considered to be well within the scope of the present disclosure.

In an example, the conductive patterns 330 are formed by printing conductive paste including a conductive metal and having a predetermined thickness on each of the ceramic layers.

For example, the conductive patterns 330 may be formed of a material such as, for example, silver (Ag), copper (Cu), or alloys thereof, but the present disclosure is not limited thereto.

In an example, a number of stacked ceramic layers on which the conductive patterns 330 are formed are varied in consideration of needed inductance or electrical properties as designed.

In an example, at least two of the conductive patterns 330 include a connection patterns 350 respectively led to opposing end surfaces of the ceramic body 310. In an example, the connection patterns 350 is electrically connected to the first and second external electrodes 360 and 370 formed on the opposing end surfaces of the ceramic body 310.

The conductive via 340 may penetrate through each of the ceramic layers and electrically connect the stacked conductive patterns 330 to complete the second coil member 320 of the second inductor 300.

When the conductive patterns 330 of the second inductor 300 are stacked in a thickness direction of the second inductor 300 is described the examples shown in FIGS. 1-3, but the present disclosure is not limited thereto and a conductive pattern may be formed as a monolayer. Also, the examples described above may be modified such that a conductive wire or a strap wire, rather than a pattern, may also be disposed in the ceramic body 310.

In an example, the hybrid inductor is completed by coupling the first inductor 200 as a board type inductor and the second inductor 300 as a surface-mounted device type inductor.

In an example, when the hybrid inductor is configured, a surface-mounted device type inductor having various capacities may be previously provided as the second inductor 300 and the selected second inductor may be mounted on the first inductor 200 as needed to complete the hybrid inductor.

For example, the first inductor 200 to be positioned below the second inductor 300 as a surface-mounted device type inductor may be formed to have the first coil member 220 having the same form or shape as that of the second coil member 320 of the second inductor 300, and the selected second inductor 300 may be mounted on the first inductor 200.

In an example, the second coil member 320 of the second inductor 300 may be disposed to be concentric with the first coil member 220 of the first inductor 200.

In an example, the second inductor 300 is selected to have a capacity value, i.e., 0.55 nH, and the first inductor 200 is selected to have a capacity value of 1.55 nH. The first inductor 200 may be included to provide more accurate inductance and may provide inductance which is not provided only by the second inductor 300.

Also, shortage of inductance of the first inductor 200, a board type inductor, due to a process error may be compensated by selecting one of surface-mounted device type inductors having various capacities, as the second inductor 300.

In the hybrid inductor, since an insufficient capacity of one inductor is complemented using another inductor, inductance difficult to realize by only one inductor may be provided.

Meanwhile, when two types of inductor are connected in series, a capacity value of the inductors is arithmetically equal to the sum of the capacity values of the two inductors. Thus, inductance of the hybrid inductor including a combination of the second inductor 300 having a capacity value of 0.55 nH, for example, and the first inductor 200 having a capacity value of 1.55 nH, for example, may be arithmetically 2.1 nH (0.55+1.55=2.1 nH).

However, as illustrated in FIG. 4, as for inductance of the hybrid inductor, mutual inductance is generated between the first inductor 200 and the second inductor 300 to provide additional inductance.

Thus, according to a result of actually interpreting the hybrid inductor, inductance of about 2.3 nH higher than the capacity value of the arithmetic sum is induced as illustrated in the graph of FIG. 4.

In an example, a direction in which the coil member 220 of the first inductor 200 is wound and a direction in which the coil member 320 of the second inductor 300 is wound are same, so that mutual inductance can be increased. If the coil members 220 and 320 are designed in mutually opposite directions, mutual inductance serve to cancel out inductance of each inductor, generating inductance lower than the capacity value of the actual arithmetic sum.

In the example described above with reference to FIG. 4, it can be seen that the hybrid inductor has increased the inductance by about 10% by combining the second inductor 300 having the capacity value of 0.55 nH and the first inductor 200 having the capacity value of 1.55 nH. If an inductor having a greater capacity value is selected or designed as the second inductor as a surface-mounted device type inductor, mutual inductance may be further increased to obtain an increase in inductance higher than 10%.

In an example, where the inductor is reduced in size, a quality factor may inevitably be lowered. However, when the second inductor 300 and the first inductor 200 are combined like the hybrid inductor, an overall quality factor may be enhanced, relative to the case of using only the second inductor. This is because the overall quality factor is increased by the quality factor of the first inductor embedded in the board 100.

In the hybrid inductor, the first inductor 200, a board type inductor, is formed within the main board and the second inductor 300, a surface-mounted device type inductor, is mounted on the main board and electrically connected to the first inductor 200. Thus, the hybrid inductor of the present disclosure may be completed by utilizing the main board without a separate board, like the separate board 100.

In FIGS. 1-3, an example where one first inductor 200 and one second inductor 300 are included in one board 100 is described, but the present disclosure is not limited thereto and a plurality of first inductors and a plurality of second inductors may be included in a single board or a main board.

Figure 5:
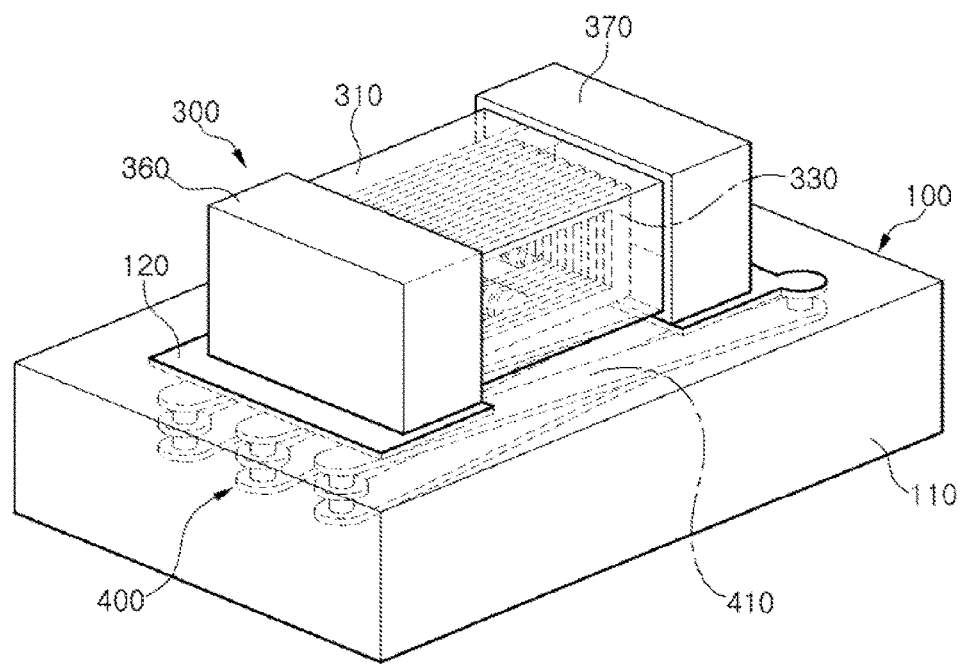
FIG. 5 is a diagram illustrating an example of a hybrid inductor.
Figure 6:
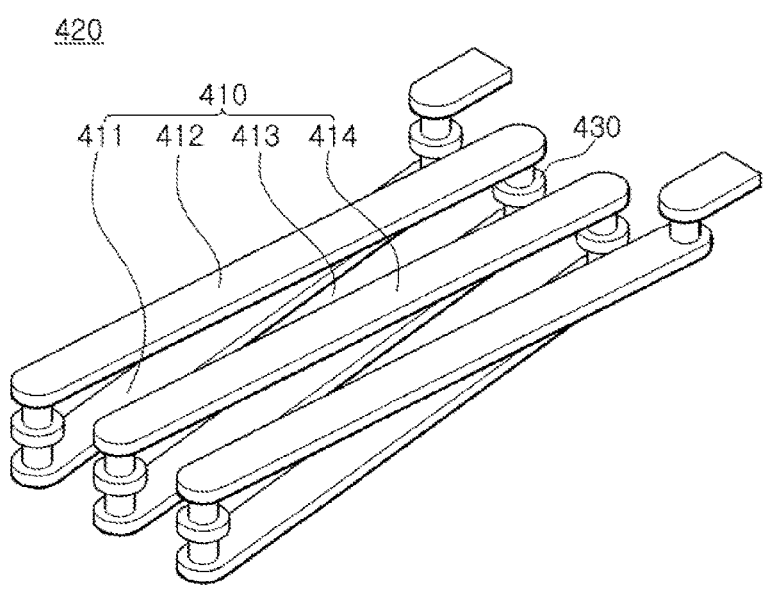
FIG. 6 is a diagram illustrating an example of a first coil member of a first inductor illustrated in FIG. 5.
Figure 7:
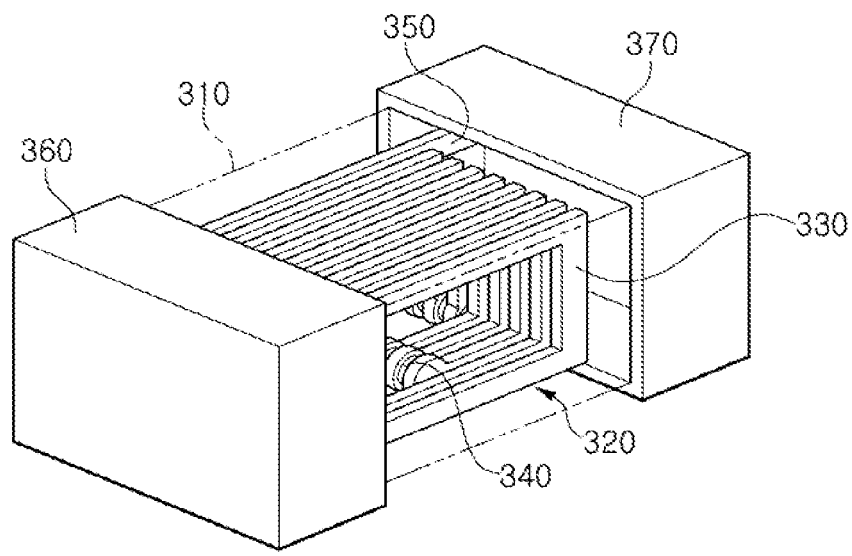
FIG. 7 is a diagram illustrating an example of a second coil member of a second inductor illustrated in FIG. 5.

FIG. 5 is a diagram illustrating an example of a hybrid inductor, FIG. 6 is a diagram illustrating an example of a first coil member of a first inductor illustrated in FIG. 5, and FIG. 7 is a diagram illustrating an example of a second coil member of a second inductor illustrated in FIG. 5.

As illustrated in FIGS. 5 to 7, a hybrid inductor includes a board 100, a first inductor 400 provided in the board 100 and including a plurality of conductive patterns 410 having inductance and different heights, and a second inductor 300 mounted on the board 100 and electrically connected to the conductive pattern 410 in one end thereof.

The components for the example illustrated in FIGS. 5 to 7, except a configuration of the first inductor 400 and a disposition relation of each coil member components, are the same as those of the examples disclosed in FIGS. 1-3. In addition to the description of FIGS. 5 to 7 below, the above descriptions of FIGS. 1-4, are also applicable to FIGS. 5 to 7, and are incorporated herein by reference. Thus, the above description may not be repeated here.

In an example, the first inductor 400 is a board type inductor embedded in the board 100. In an example, the first inductor 400 is a board type inductor in which a first coil member 420 is formed by the conductive pattern 410 in the board 100.

The conductive pattern 410 forming the first coil member 420 may be a conductive pattern formed to have inductance in the board 100.

A plurality of coil turns forming the first coil member 420 may be formed to be distributed to a plurality of conductive patterns 410 as a pair of layers. In an example, the plurality of conductive patterns 410 are formed linearly on each layer and are spaced apart from each other. In an example, the plurality of conductive patterns are disposed in parallel at a predetermined interval but are not limited thereto.

In an example, the plurality of conductive patterns 410 formed on one layer may be electrically connected to a plurality of conductive patterns formed on another layer by a connection conductor 430 penetrating through an insulating layer 110. The conductive patterns 410 may complete one continuous first coil member 420 by the connection conductor 430.

In an example, one end of the first conductive pattern 411 on a first layer may be electrically connected to one end of the second conductive pattern 412 on a second layer by the connection conductor 430, the other end of the second conductive pattern on the second layer may be electrically connected to one end of a third conductive pattern 413 on the first layer by the connection conductor 430, and the other end of the third conductive pattern on the first layer may be electrically connected to one end of a fourth conductive pattern 414 on the second layer by the connection conductor 430, thereby forming one first coil member 420.

In the hybrid inductor of FIG. 4, the conductive pattern 410 of the first coil member 420 has a solenoid structure overall. However, a structure of the conductive pattern 410 is not limited thereto.

Although not shown, a pad or a pin-type connection terminals (not shown) adhered to a main board (not shown) on which the hybrid inductor is mounted may be provided on a lower surface of the first inductor 400. In an example, the connection terminals are electrically connected to each of the first inductor 400 and the second inductor 300.

Also, as described above, the board 100 including the first inductor 400 may be formed as a main board. For example, the board 110 of the first inductor 400 is utilized as the main board when the first coil member 420 using the conductive patterns 210 and the connection pad 120 are formed in a main board on which at least one electronic component, in addition to the second inductor 300, is mounted.

As the second inductor 300, a surface-mounted device type inductor or a chip type inductor may be employed. Thus, the second inductor 300 of the present disclosure includes a ceramic body 310 and a second conductive coil member 320 formed within the ceramic body.

In an example, the second conductive coil member 320 includes stacked conductive patterns 330 and a plurality of conductive vias 340 connecting the conductive patterns 330 in parallel or in series to complete a coil.

The ceramic body 310 is formed by stacking a plurality of ceramic layers formed as sheets formed of ceramics in a thickness direction and subsequently sintering the stacked ceramic layers. A shape and dimensions of the ceramic body 310 and the number of stacked ceramic layers are not limited to those illustrated in FIGS. 5 to 7, and other shapes and dimensions may be used without departing from the spirit and scope of the illustrative examples described.

In an example, the conductive patterns 330 are formed by printing conductive paste including a conductive metal and having a predetermined thickness on each of the ceramic layers.

In an example, the conductive patterns 330 may be formed of a material such as, for example, silver (Ag), copper (Cu), or alloys thereof, but the present disclosure is not limited thereto.

In an example, a number of stacked ceramic layers on which the conductive patterns 330 are formed is varied in consideration of needed inductance or electrical properties as designed.

In an example, at least two of the conductive patterns 330 include a connection patterns 350 respectively led to opposing end surfaces of the ceramic body 310. In an example, the connection patterns 350 is electrically connected to the first and second external electrodes 360 and 370 formed on the opposing end surfaces of the ceramic body 310.

In an example, the conductive via 340 penetrates through each of the ceramic layers and electrically connects the stacked conductive patterns 330 to complete the second coil member 320 of the second inductor 300. In this manner, the second coil member 320 of the second inductor 300 may have a solenoid structure.

In the example of FIG. 5, the conductive patterns 330 of the second inductor 300 are stacked in a width direction of the second inductor 300 e, but the present disclosure is not limited thereto and a conductive pattern may be formed as a monolayer. Also, the present disclosure may be variously modified such that a conductive wire or a strap wire, rather than a pattern, may also be disposed in the ceramic body 310.

The hybrid inductor as described with reference to FIGS. 3-5 may be completed by coupling the first inductor 400 as a board type inductor and the second inductor 300 as a surface-mounted device type inductor.

When the hybrid inductor is configured, a surface-mounted device type inductor having various capacities may be previously provided as the second inductor 300 and the selected second inductor may be mounted on the first inductor 400 as needed to complete the hybrid inductor.

For example, the first inductor 400 to be positioned below the second inductor 300 as a surface-mounted device type inductor is formed to have the first coil member 420 having the same form or shape as that of the second coil member 320 of the second inductor 300, and the selected second inductor 300 may be mounted on the first inductor 400.

In an example, a central axial line of the second coil member 320 of the second inductor 300 deviates from a central axial line of the first coil member 420 of the first inductor 400 and is disposed to be parallel thereto.

In this manner, when the first inductor 400 and the second inductor 300 are disposed such that the central axial lines thereof are parallel to each other and the second inductor 300 is mounted on the first inductor 400 such that the coil members 420 and 320 of the first inductor 400 and the second inductor 300 are adjacent to each other, a magnetic field may be generated between the first inductor 400 and the second inductor 300 to generate mutual inductance, thereby increasing inductance.

In an example, a direction in which the coil member 420 of the first inductor 400 is wound and a direction in which the coil member 320 of the second inductor 300 is wound are same, so that mutual inductance can be increased. If the coil members 220 and 320 are designed in mutually opposite directions, mutual inductance serve to cancel out inductance of each inductor, causing lower inductance.

In an example, the first inductor 400 and the second inductor 300 are connected in parallel. However, connection of the first inductor 400 and the second inductor 300 is not limited thereto and the first inductor 400 and the second inductor 300 may be connected in series.

As set forth above, since mutual inductance is generated, inductance higher than a capacity value of a single inductor is obtained.

In an example, when the first inductor as a board type inductor and the second inductor as a surface-mounted device type inductor are configured, although the single surface-mounted device type inductor has a low quality factor, an overall high quality factor may be secured due to a high quality factor of the board type inductor.

Also, according to the present disclosure, shortage of inductance due to a process error of the board type inductor may be compensated by the surface-mounted device type inductor.

In the examples disclosed above, a space in which the surface-mounted device type inductor is mounted is expanded three-dimensionally and a board type inductor having the same form or shape as that of the surface-mounted device type inductor is formed on one side of the surface-mounted device type inductor to generate mutual inductance, to provide a hybrid inductor that is compact and has increased inductance.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A hybrid inductor comprising: a board; a first inductor provided in the board and comprising conductive patterns disposed at different heights; and a second inductor mounted on the board and an end of the second inductor being connected to the conductive patterns.

2. The hybrid inductor of claim 1, wherein the conductive patterns form a first coil member.

3. The hybrid inductor of claim 2, wherein the second inductor comprises a second coil member within a ceramic body.

4. The hybrid inductor of claim 3, wherein the second coil member is concentric with the first coil member.

5. The hybrid inductor of claim 4, wherein a winding direction of the first coil member and a winding direction of the second coil member are same.

6. The hybrid inductor of claim 4, wherein each conductive pattern of the conductive patterns comprise a coil turn on a layer, and the conductive patterns are connected to each other by a connection conductor penetrating through an insulating layer.

7. The hybrid inductor of claim 3, wherein a central axial line of the second coil member is offset from and parallel to a central axial line of the first coil member.

8. The hybrid inductor of claim 7, wherein a winding direction of the first coil member and a winding direction of the second coil member are same.

9. The hybrid inductor of claim 7, wherein the conductive patterns are linearly formed on a first layer and are spaced apart from each other, and the conductive patterns formed on the first layer are connected to other conductive patterns formed on a second layer by a connection conductor penetrating through an insulating layer.

10. The hybrid inductor of claim 1, further comprising: a connection pad provided on a surface of the board and the second inductor being mounted on the connection pad.

11. The hybrid inductor of claim 10, further comprising: an electronic component mounted on the board.

12. The hybrid inductor of claim 3, wherein the second coil member comprises stacked conductive patterns and conductive vias connecting the stacked conductive patterns.

13. The hybrid inductor of claim 12, wherein the stacked conductive patterns are connected in parallel.

14. The hybrid inductor of claim 12, wherein the stacked conductive patterns are connected in series.

15. The hybrid inductor of claim 12, wherein each stacked conductive pattern of the stacked conductive patterns comprise a conductive metal having a preset thickness being disposed in a ceramic layer.

16. A hybrid inductor comprising: a board-type inductor comprising conductive patterns that are disposed at different heights of the board; and a surface-mounted device type inductor mounted on the board type inductor and having an end connected to the conductive patterns, wherein the board type inductor is embedded in a board.

17. The hybrid inductor of claim 16, wherein a coil member of the surface-mounted device type inductor is disposed to be concentric with a coil member of the board type inductor.

18. The hybrid inductor of claim 17, wherein the coil member of the surface-mounted device type inductor and the coil member of the board type inductor each have a solenoid structure, and a central axial line of the coil member of the surface-mounted device type inductor is parallel to a central axial line of the coil member of the board type inductor.

19. The hybrid inductor of claim 16, wherein the board type inductor is mounted on a board.

* * * * *